United States Patent
Kasahara et al.

(10) Patent No.: US 9,252,027 B1
(45) Date of Patent: Feb. 2, 2016

(54) METHOD OF FORMING PATTERN, MANUFACTURING METHOD OF SEMICONDUCTOR DEVICE AND TEMPLATE

(71) Applicant: Kabushiki Kaisha Toshiba, Minato-ku, Tokyo (JP)

(72) Inventors: Yusuke Kasahara, Kanagawa (JP); Kei Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/644,880

(22) Filed: Mar. 11, 2015

(30) Foreign Application Priority Data

Sep. 12, 2014 (JP) ................. 2014-186514

(51) Int. Cl.
*H01L 21/31* (2006.01)
*H01L 21/475* (2006.01)
*H01L 21/02* (2006.01)

(52) U.S. Cl.
CPC ........ *H01L 21/475* (2013.01); *H01L 21/02348* (2013.01)

(58) Field of Classification Search
CPC ................ H01L 21/475; H01L 21/02348
USPC ........................................ 438/761
See application file for complete search history.

(56) References Cited

U.S. PATENT DOCUMENTS

| | | | |
|---|---|---|---|
| 8,398,868 B2 | 3/2013 | Cheng et al. | |
| 2015/0205207 A1* | 7/2015 | Seshimo et al. | H01L 21/77 430/324 |

FOREIGN PATENT DOCUMENTS

| | | |
|---|---|---|
| JP | 3967114 | 8/2007 |
| JP | 4673266 | 4/2011 |
| JP | 2013-179218 | 9/2013 |

* cited by examiner

*Primary Examiner* — Bradley K Smith
(74) *Attorney, Agent, or Firm* — Finnegan, Henderson, Farabow, Garrett & Dunner, L.L.P.

(57) ABSTRACT

In accordance with an embodiment, a method of forming a pattern includes forming a first layer on a fabrication target film, making a mold and the first layer push each other to form a protrusion on the fabrication target film, and forming first and second regions, forming a block copolymer layer including first and second blocks in the first and second regions, phase-separating the block copolymer layer, forming second and third layers in the first region, and forming fourth and fifth layers in the second region; and removing the third and fifth layers. The first region is surrounded by the first layer and the protrusion. The second region is surrounded by the first layer and contacts the first region via the protrusion. The third layer is surrounded by the second layer. The fifth layer is surrounded by the fourth layer.

17 Claims, 7 Drawing Sheets

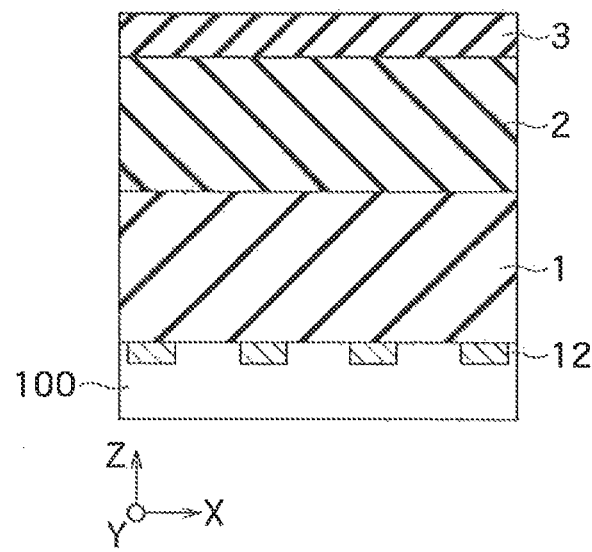
FIG. 1
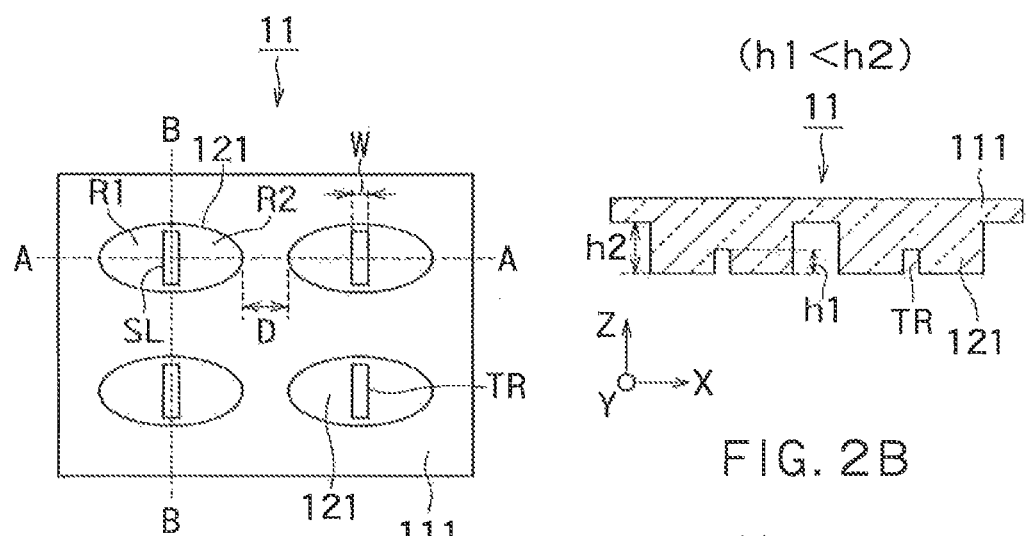
FIG. 2A
FIG. 2B
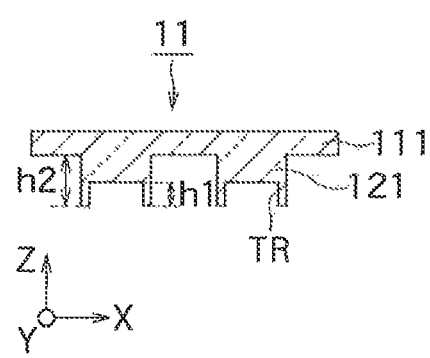
FIG. 2C $2a < b < 4a$
$2a < c < 4a$ $a < d < 4a$

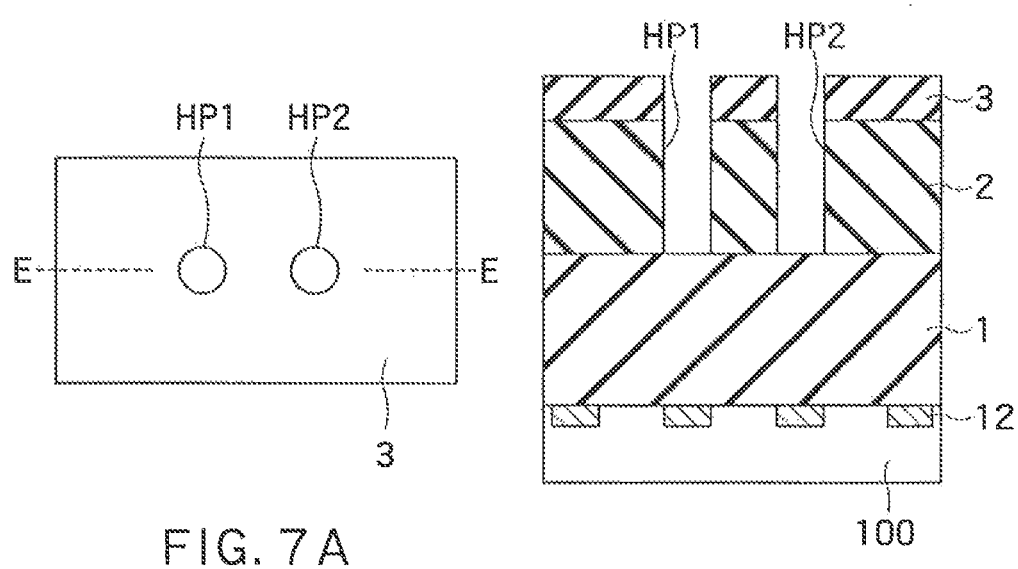
FIG. 7A
FIG. 7B
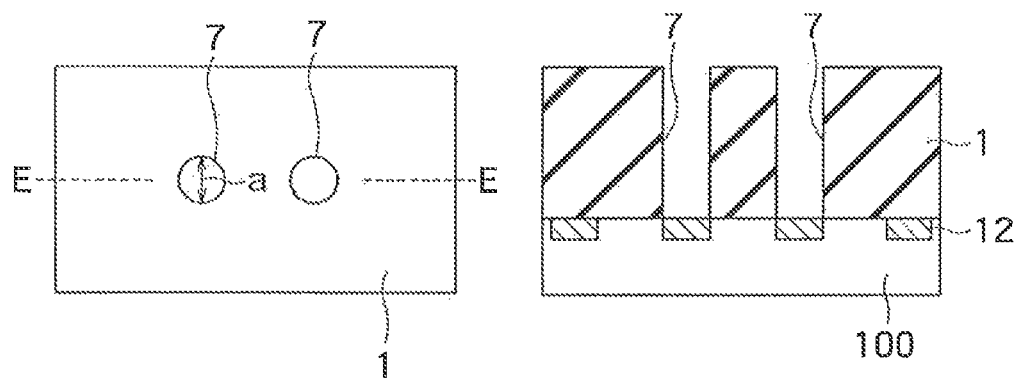
FIG. 8A
FIG. 8B

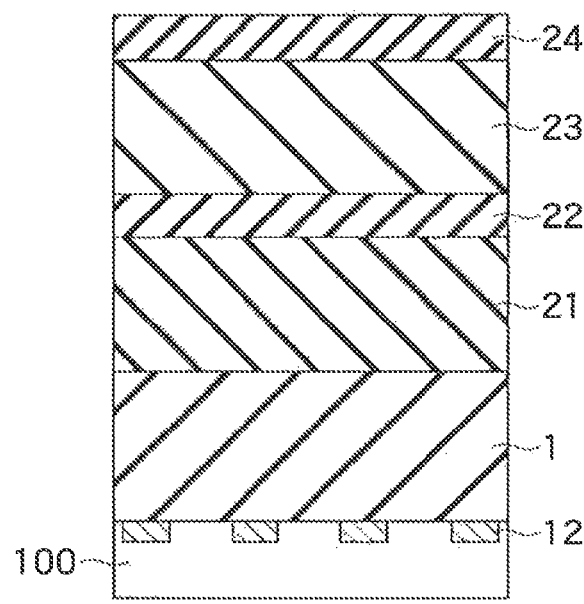
FIG. 9
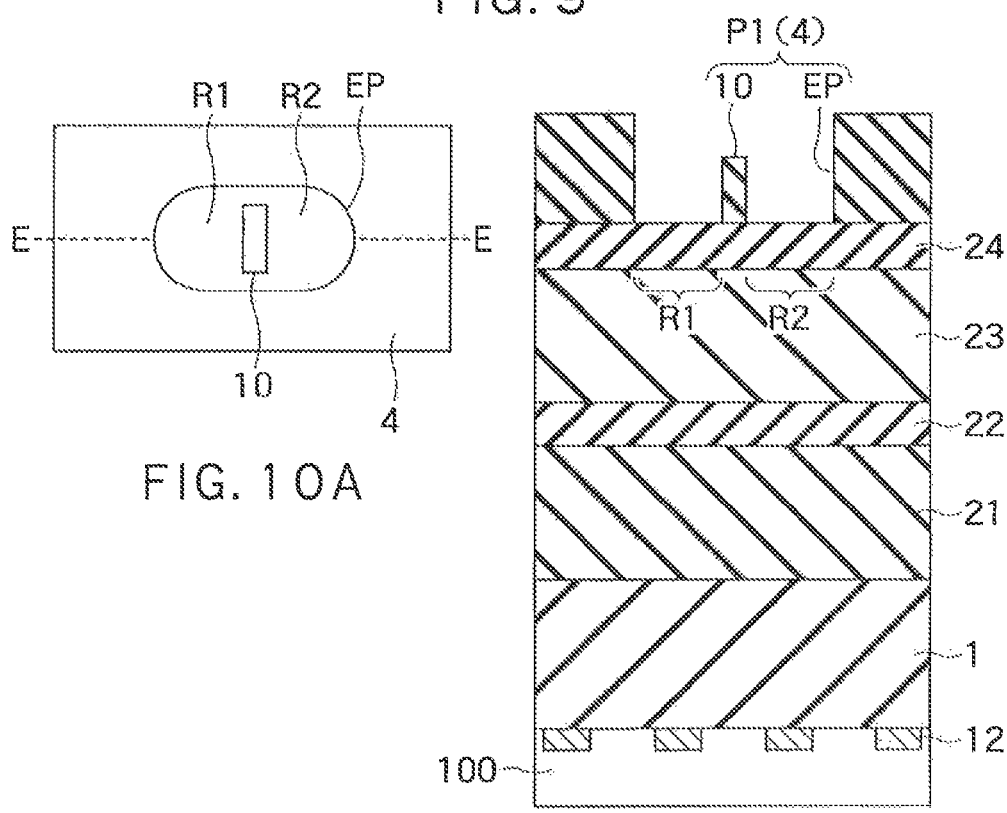
FIG. 10A
FIG. 10B

METHOD OF FORMING PATTERN, MANUFACTURING METHOD OF SEMICONDUCTOR DEVICE AND TEMPLATE

CROSS REFERENCE TO RELATED APPLICATIONS

This application is based upon and claims the benefit of priority from the prior Japanese Patent Application No. 2014-186514, filed on Sep. 12, 2014, the entire contents of which are incorporated herein by reference.

FIELD

Embodiments described herein relate generally to a method of forming a pattern, a manufacturing method of a semiconductor device and a template.

BACKGROUND

Nanometer level fabrication sizes are required in the manufacture of semiconductor devices that are increasingly miniaturized. New techniques that replace photolithography are needed to meet the requirement.

Self-assembly lithography is drawing attention as one such technique. The self-assembly lithography is a method of forming a micropattern as follows: A fabrication target film is coated with a block copolymer that constitutes a nano-order rule structure, and the block copolymer is then phase-separated. One block is removed, and the other block is used as a mask to fabricate the fabrication target film.

A directed self-assembly (DSA) technique has been developed as a method of controlling the directionality of a natural regular pattern. According to this technique, a guide pattern is formed on a fabrication target film by photolithography. The guide pattern is coated with a block copolymer, and an artificial order is thereby given to the natural phenomenon pattern.

However, it has been difficult to accurately form micro hole patterns even by the use of the DSA technique.

BRIEF DESCRIPTION OF THE DRAWINGS

In the accompanying drawings:

FIG. 1 is an example of a schematic sectional view illustrating a pattern forming method according to Embodiment 1;

FIGS. 2A to 2C are examples of a plan view and end elevations showing a template according to one embodiment;

FIGS. 3A to 8B are examples of schematic plan views and end elevations illustrating the pattern forming method according to Embodiment 1;

FIG. 9 is an example of a schematic sectional view illustrating a pattern forming method according to Embodiment 2; and FIGS. 10A to 14B are examples of schematic plan views and end elevations illustrating the pattern forming method according to Embodiment 2.

DETAILED DESCRIPTION

Figure 3A:
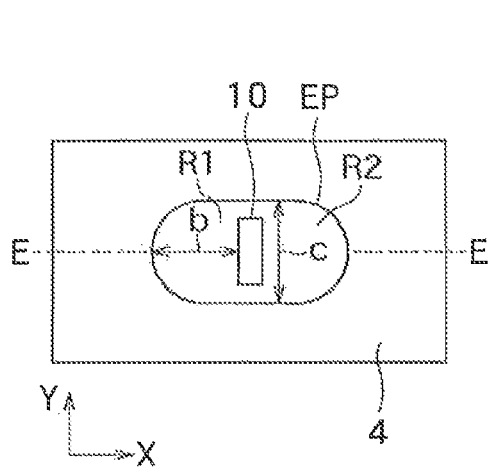

In accordance with an embodiment, a method of forming a pattern includes forming a first layer on a fabrication target film, making a mold and the first layer push each other to form a protrusion on the fabrication target film, and forming a first region and a second region, forming a block copolymer layer including first and second blocks in the first region and the second region, phase-separating the block copolymer layer, forming a second layer and a third layer in the first region, and forming a fourth layer and a fifth layer in the second region; and removing the third and fifth layers. The first region is surrounded by the first layer and the protrusion. The second region is surrounded by the first layer and contacts the first region via the protrusion. The third layer is surrounded by the second layer. The fifth layer is surrounded by the fourth layer.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus.

In the specification of the present application, "stacking" not only includes stacking layers in contact with each other but also includes staking layers with another layer interposed in between. "Providing on" not only includes providing a layer in direct contact with a layer but also includes providing a layer on a layer with another layer interposed therebetween. Moreover, terms indicating directions such as "upper" and "lower" in the explanation show relative directions when a wiring formation side in a given layer on a later-described substrate is set as the top. Therefore, the directions may be different from actual directions based on gravitational acceleration directions.

The formation of contact holes which are connected to a micro wiring line provided on the surface of a given layer on a silicon substrate is described below by way of example. However, it is to be noted that the present invention is not limited to such an example and is available to micro hole patterns in general.

(1) Embodiment 1

As shown in FIG. 1, a line-and-space wiring line 12 is formed on the surface part of a given layer 100 on a silicon substrate (not shown) after a process such as multipatterning.

First, as shown in FIG. 1, a TEOS film 1 having a thickness of about 200 nm is formed on the layer 100, for example, by plasma CVD. An organic film 2 having a thickness of about 150 nm is then formed on the TEOS film 1, for example, by spin coating. In the present embodiment, the TEOS film 1 and the organic film 2 correspond to, for example, fabrication target films.

As shown in FIG. 1, a spin-on-glass (SOG) film 3 having a thickness of about 40 nm is then formed on the organic film 2, for example, by spin coating. In the present embodiment, the SOG film 3 corresponds to, for example, a first layer.

A guide pattern is then created on the SOG film 3 by nanoimprint lithography (hereinafter briefly referred to as "NIL").

More specifically, the SOG film 3 is spin-coated with a resist 4 (see FIG. 3) having UV cure properties. A template 11 such as a template 11 shown in FIGS. 2A to 2C in which a pattern corresponding to a target guide pattern is formed is disposed so that a pattern formation surface faces downward. The template 11 and the resist 4 are then moved closer to each other so as to contact each other, and made push each other.

FIG. 2A is an example of a plan view showing the template 11 according to one embodiment. FIGS. 2B and 2C are examples of end elevations taken along the line A-A and the line B-B in FIG. 2A, respectively. As shown in FIGS. 2A to 2C, the template 11 includes an elliptical transmissive pattern 121 provided on a substrate made of a transmissive material such as a quartz glass substrate 111. The transmissive pattern 121 includes a first region R1 and a second region R2. The transmissive pattern 121 is provided with a slit trench TR in a minor axis direction, that is, a Y-direction in FIG. 2A. That is, the trench TR is provided between the first region R1 and the second region R2. The height (length in a Z-direction in FIG. 2B perpendicular to the horizontal surface of the quartz glass substrate 111) of the transmissive pattern 121 is h2. The depth (length in the Z-direction in FIG. 2B) of the trench TR is h1. In this case, their relation is $$h1<h2 \tag{1}.$$

UV light is applied to the template 11 from the direction opposite to the side of the resist 4 while the template 11 is pressed into the resist 4, and the resist 4 is thereby cured. If the template 11 is separated from the resist 4 after cured, a pattern P1 in which a protrusion 10 is provided in the central region of the bottom of an elliptical cut pattern EP can be formed, as shown in FIG. 3A and in FIG. 3B which is an end elevation of a section taken along the line E-E in FIG. 3A. That is, the pattern P1 has the first region R1 and the second region R2 which are each surrounded by the resist 4 and which contact each other via the protrusion 10. FIG. 4B, FIG. 5B, FIG. 6B, FIG. 7B, FIG. 8B, FIG. 10B, FIG. 11B, FIG. 12B, FIG. 13B, and FIG. 14B that follow are end elevations of a section E-E in FIG. 4A, FIG. 5A, FIG. 6A, FIG. 7A, FIG. 8A, FIG. 10A, FIG. 11A, FIG. 12A, FIG. 13A, and FIG. 14A, respectively.

If the diameter of a circumscribed circle of a hole pattern to be finally formed is a (see FIG. 8), it is preferable that the minor axis of the elliptical pattern EP, that is, a diameter "c" in the Y-direction that intersects at right angles with an X-direction in which the first and second regions range satisfies the relation:

$$2a<c<4a \tag{2}.$$

The distance between the protrusion 10 and the sidewall of the elliptical pattern EP in a major axis direction of the elliptical pattern EP, that is, in a direction parallel to the direction in which the first and second regions range is "b". In this case, it is preferable to satisfy the relation:

$$2a<b<4a \tag{3}.$$

Although the shape of the pattern EP shown is elliptical, the shape of the pattern EP is not limited thereto but may be circular.

The pattern P1 is then used as a physical guide to self-assemble a BCP.

Figure 4A:
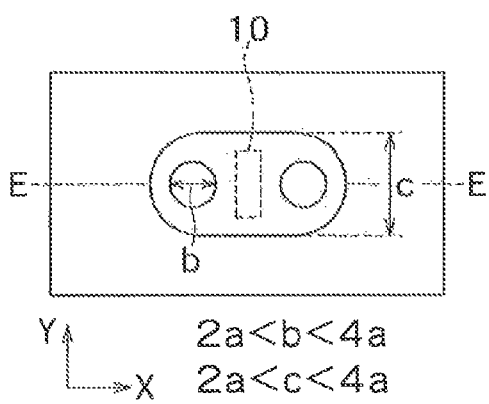
Figure 4B:
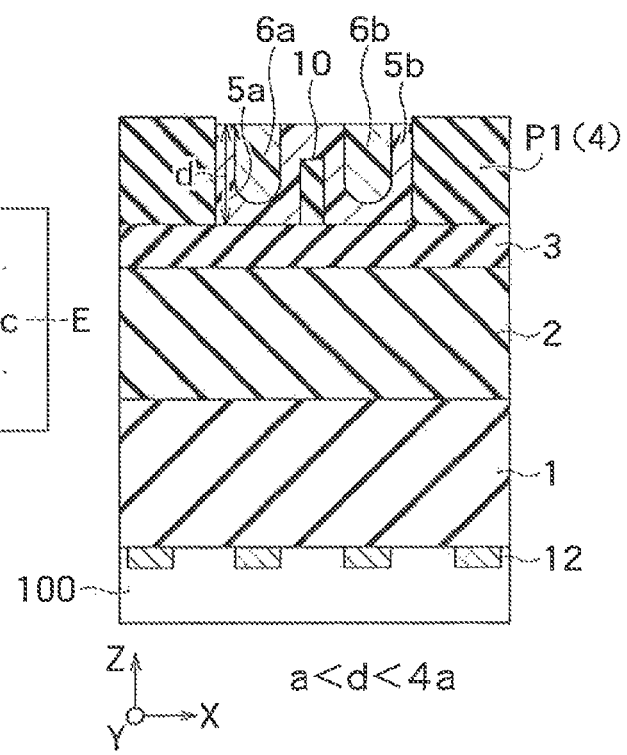

More specifically, the BCP having such a thickness as to bury the pattern P1 is applied. Here, PS-b-PMMA is used as the BCP. The BCP is then self-assembled by about one minute of annealing at about 250° C. Consequently, as shown in FIGS. 4A and 4B, the BCP is phase-separated into parts 5a and 5b in which PS has cohered (hereinafter referred to as "PS cohesion parts") and parts 6a and 6b in which PMMA has cohered (hereinafter referred to as "PMMA cohesion parts"). In the present embodiment, the PS cohesion part 5a and the PMMA cohesion part 6a respectively correspond to a second layer and a third layer, and the PS cohesion part 5b and the PMMA cohesion part 6b respectively correspond to a fourth layer and a fifth layer.

Here, it is preferable to satisfy the relation:

$$a<d<4a \tag{4},$$

wherein "d" is the thickness of the BCP after self-assembled.

Figure 5A:
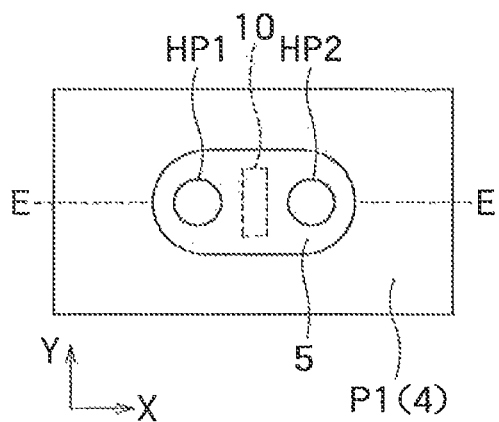
Figure 5B:
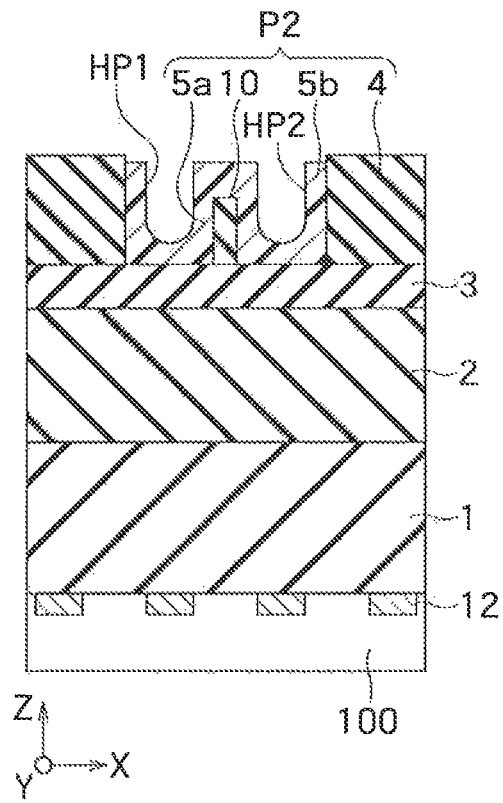

By the application of UV light from the upper side of the pattern P1 (the side opposite to the side of the layer 100), bonds in the PMMA cohesion part 6 are then cut into lower molecules, and cleaning is performed with isopropyl alcohol. As a result, as shown in FIGS. 5A and 5B, the PMMA cohesion parts 6a and 6b alone are detached, and a pattern P2 composed of the PS cohesion parts 5a and 5b and the resist 4 remains as a mask. Thus, hole patterns HP1 and HP2 which have shrunk in both diametrical dimension (CD) and space (pitch) compared to those after NIL are formed.

Figure 6A:
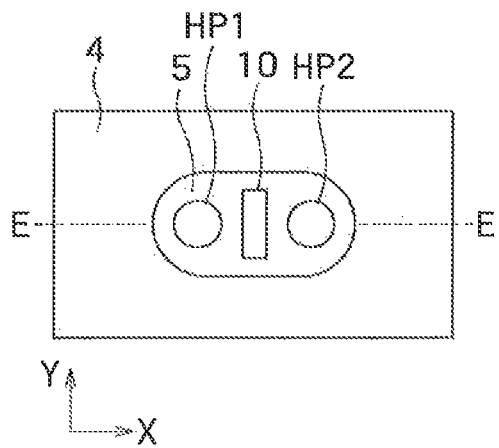
Figure 6B:
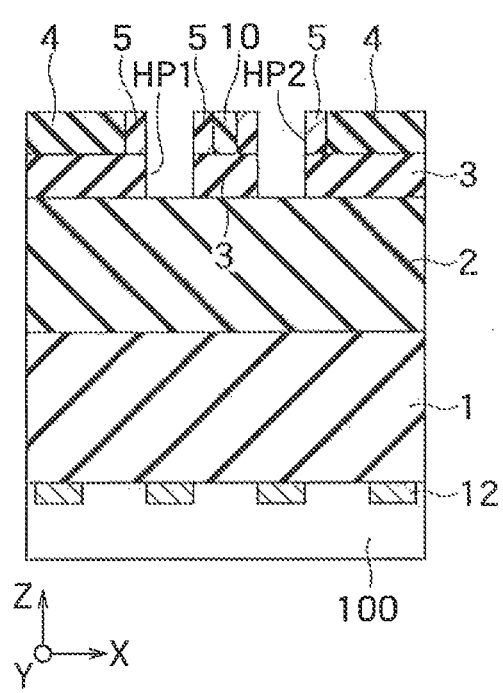

The PS cohesion parts 5a and 5b remaining on the bottom of the elliptical cut pattern EP are then removed by performing RIE using, for example, a two-frequency superposition parallel-plate-type reactive ion etching (RIE) apparatus. As shown in FIGS. 6A and 6B, a PS film 5 remaining on the resist 4 and the sidewall is used as a mask to transfer the pattern to the SOG film 3.

As shown in FIGS. 7A and 7B, the SOG film 3 is then used as a mask to transfer the pattern to the organic film 2. The organic film 2 to which the pattern has been transferred is used as a mask to further transfer the pattern to the TEOS film 1. The organic film 2 is then removed after ashing. Consequently, as shown in FIGS. 8A and 8B, contact holes 7 which have shrunk in diametrical dimension (CD) and space (pitch) compared to the hole pattern after the NIL can be formed.

If the PMMA cohesion parts 6a and 6b are greatly displaced after self-assembly, defects such as an electric short circuit between the PMMA cohesion parts 6a and 6b and the adjacent wiring line may occur after the formation of a contact.

However, when the physical guide having the protrusion provided on the bottom of the elliptical pattern EP is used as in the present embodiment, the place of the PMMA cohesion is restricted at the time of the BCP phase separation, so that the displacement of the hole patterns HP1 and HP2 can be inhibited. Thus, it is possible to prevent the occurrence of defects such as a short circuit in the subsequent process.

If there is not any component on the bottom of the elliptical pattern EP, the adjacent PMMA cohesion parts 6a and 6b may be connected on the bottom at the time of the BCP phase separation. The problem in this case is that holes may be connected due to the shortage of a mask between holes formed by self-assembly when the pattern is transferred to the SOG film 3.

Figure 3B:
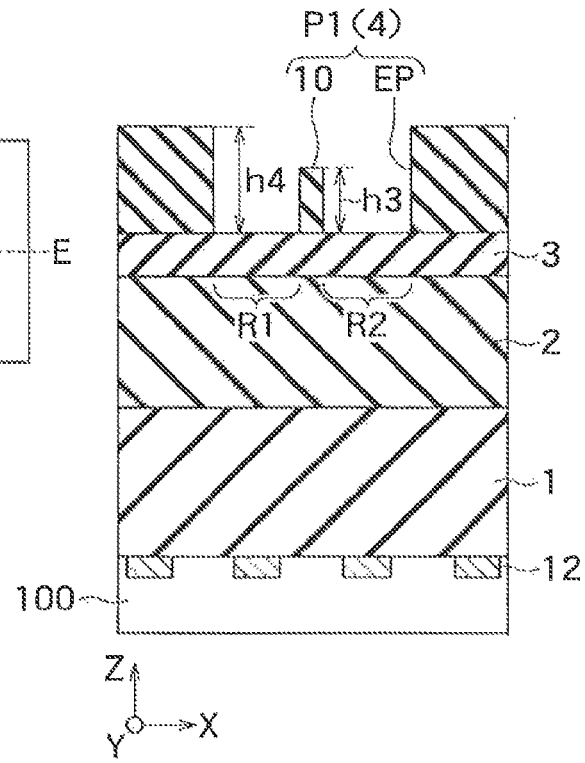

However, this problem can be avoided when the protrusion 10 is provided on the bottom of the elliptical pattern EP as in the present embodiment, so that the PMMA cohesion parts 6a and 6b (see FIG. 4) are not connected to each other in the first region R1 and the second region R2 if the height of the lowest position of the protrusion 10, for example, the length h3 in the Z-direction in the example shown in FIG. 3B is equal to or more than ⅓ of the height of the thickest part of the pattern P1, for example, the height (length in the Z-direction) h4 of the side surface of the resist 4 (less than h4) in the example shown in FIG. 3B. In the present embodiment, the Z-direction corresponds to a first direction, and the lengths h3 and h4 respectively correspond to first and second lengths.

Here, the template 11 in FIG. 2 is taken as an example to describe a method of creating a template used in the NIL process in the present embodiment.

A transmissive substrate such as a quartz glass substrate is coated with a resist which is sensitive to an electron beam (hereinafter briefly referred to as "EB"), and a pattern having a slit (see the sign SL in FIG. 2) is drawn in an ellipse (see the sign 121 in FIG. 2) by EB drawing. Here, the width (see the sign W in FIG. 2) of the slit in the ellipse is set to be smaller than the distance (see the sign D in FIG. 2) between ellipses (W<D).

If RIE is performed after the formation of this pattern, a difference of etching rate arises between the region of the pattern in the slit and the peripheral region of the elliptical pattern, and the etching rate in the region of the slit pattern becomes lower than the etching rate in the peripheral region of the elliptical pattern.

Thus, the cut pattern in the ellipse becomes lower in etching amount than the peripheral region of the ellipse. As a result, the template 11 shown in FIG. 2 can be obtained.

(2) Embodiment 2

Although the resist is used as the physical guide in the example described above in Embodiment 1, the present invention is not limited to this. It is also possible to transfer a resist pattern to a given lower (fabrication target film side) film, and use the film to which the pattern has been transferred as the physical guide for the self-assembly of the BCP. Such an example is concretely described as Embodiment 2.

First, as in Embodiment 1 described above, a TEOS film 1 having a thickness of about 200 nm is formed on a given layer 100 (see FIG. 9) (on an unshown silicon substrate) having a line-and-space wiring line 12 formed on the surface part, for example, by plasma CVD (see FIG. 9).

An organic film 21 (see FIG. 9) having a thickness of about 150 nm is then formed on the TEOS film 1, for example, by CVD. A silicon oxide film 22 (see FIG. 9) having a thickness of about 30 nm is further formed on the organic film 21, for example, by CVD. In the present embodiment, the silicon oxide film 22, the organic film 21, and the TEOS film 1 correspond to, for example, fabrication target films.

An organic film 23 having a thickness of about 150 nm is then formed on the silicon oxide film 22, for example, by spin coating. Further, as shown in a sectional view of FIG. 9, a SOG film 24 having a thickness of about 40 nm is then formed on the organic film 23, for example, by spin coating.

A guide pattern is then formed by NIL. First, the SOG film 24 is spin-coated with a resist 4 (see FIG. 10) having UV cure properties. A template 11 shown in, for example, FIG. 2 is disposed so that a pattern formation surface faces downward. The template 11 is then put into abutment with the resist 4, and further pressed toward the layer 100.

UV light is applied from the direction opposite to the layer 100 while the template 11 is pressed into the resist 4, and the resist 4 is thereby cured. If the template 11 is separated from the resist 4 after cured, a pattern P1 similar to that in Embodiment 1 in which a protrusion 10 is provided in the central region of the bottom of an elliptical cut pattern EP can be formed on the SOG film 24, as shown in FIG. 10A and in FIG. 10B.

Figure 11A:
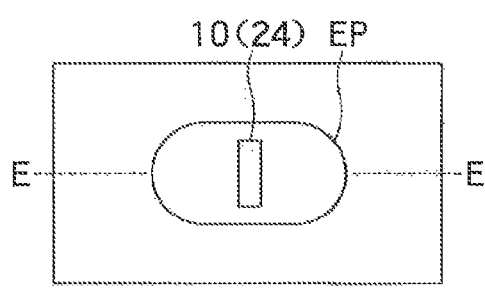
Figure 11B:
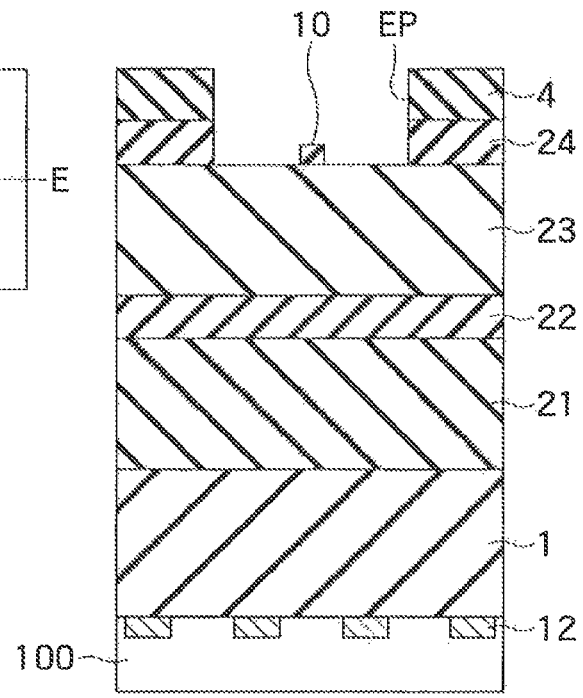
Figure 12A:
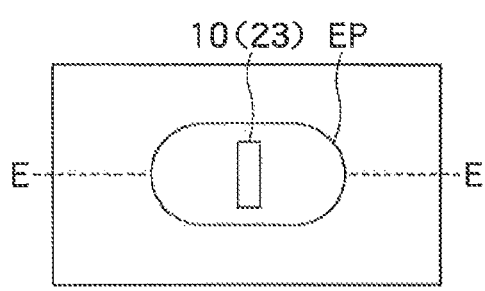
Figure 12B:
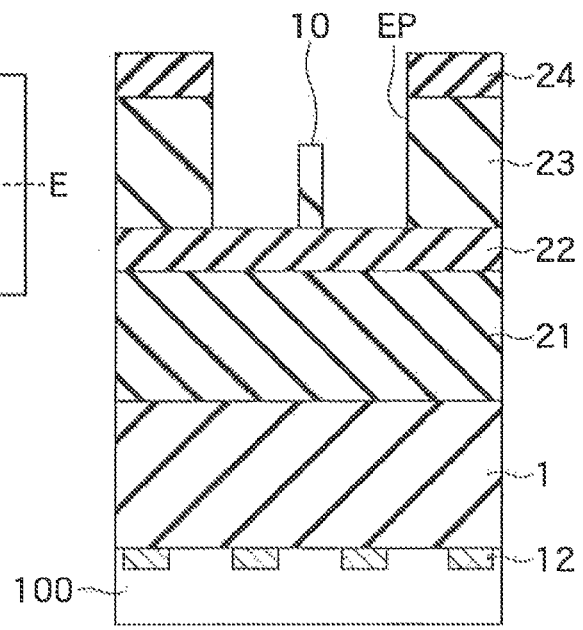

As shown in FIGS. 11A and 11B, the resist 4 to which the pattern P1 has been transferred is transferred to the SOG film 24, for example, by RIE. The SOG film 24 to which the pattern P1 has been transferred is then used as a mask to fabricate the organic film 23, and the shape of the pattern P1 is transferred to the organic film 23, as shown in FIGS. 12A and 12B.

The organic film 23 to which the pattern P1 has been transferred is used as a physical guide to self-assemble a BCP as in Embodiment 1. Thus, as in Embodiment 1, it is possible to inhibit the displacement of the PMMA cohesion parts (see the signs 6a and 6b in FIG. 4) and the joining of the PMMA cohesion parts on the hole bottom. If the pattern (see the sign P2 in FIG. 5) formed by DSA as above is transferred to the silicon oxide film 22, the organic film 21, and the TEOS film 1 in a manner similar to Embodiment 1, contact holes (see the sign P7 in FIG. 8) which have shrunk in diametrical dimension (CD) and space (pitch) compared to the pattern after the NIL can be formed.

Figure 13A:
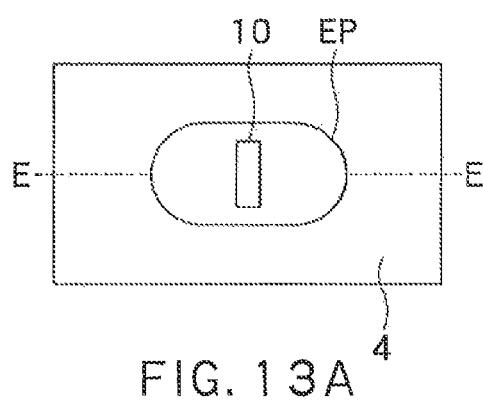
Figure 13B:
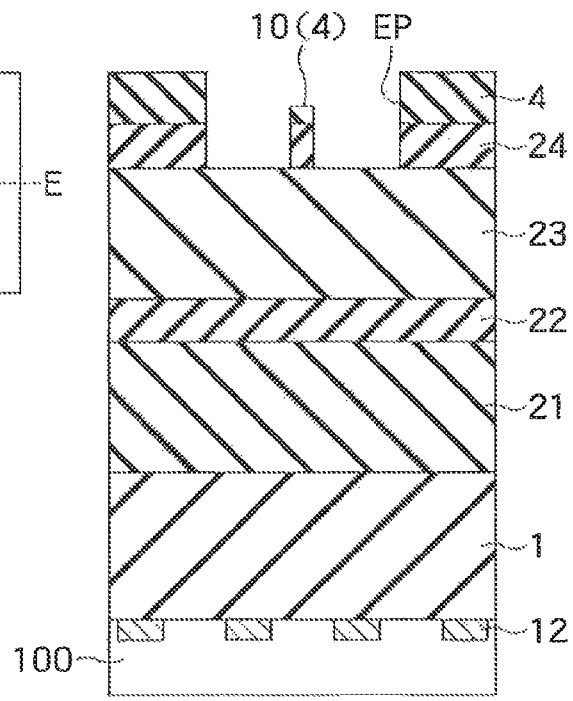

Here, highly selective fabrication is possible by the use of a gas-based RIE condition mainly including, for example, any one of $CHF_3$, $CH_2F_2$, $C_4F_8$, $C_4F_6$, $C_5F_8$, and $C_5HF_7$ when the resist 4 to which the pattern P1 has been transferred is transferred to the SOG film 24. As shown in FIGS. 13A and 13B, the resist 4 can be transferred to the SOG film 24 without partial disappearance of the protrusion 10 in the height direction (direction perpendicular to the surface of the layer 100).

Figure 14A:
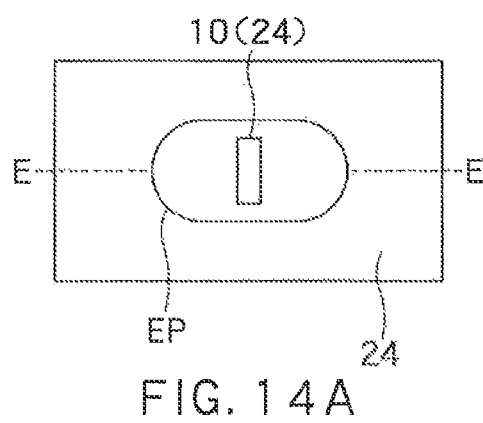
Figure 14B:
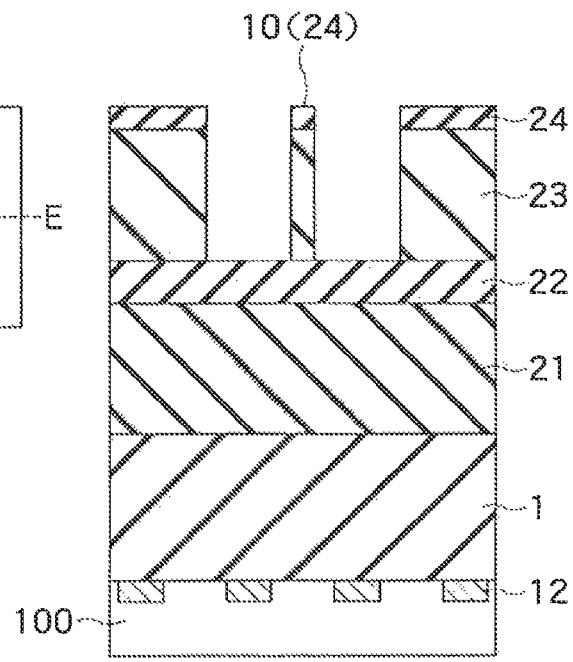

When the SOG film 24 which includes the part of the protrusion 10 having the same height as the peripheral part of the elliptical pattern EP is used as a mask to fabricate the organic film 23 as above, the shape of the pattern P1 can also be transferred to the organic film 23 without partial disappearance in the region corresponding to the protrusion 10, as shown in FIGS. 14A and 14B.

In the example shown in FIG. 13A to FIG. 14B that uses the highly selective condition, it is possible to inhibit dimensional variation in the lateral direction (direction parallel to the surface of the layer 100) of the physical guide. Therefore, this example is more advantageous to the inhibition of variation after self-assembly than the example shown in FIG. 11A to FIG. 12B.

Thus, according to Embodiment 2, the SOG film 24, or the SOG film 24 and the organic film 23 are used as the physical guide, so that it is possible to inhibit the reduction of the thickness of the physical guide at the time of the development of the BCP.

Although two holes are formed from one physical guide in the case described above in the embodiments, the present invention is not limited to this. The present invention is also applicable when three or more holes are formed from one physical guide.

Although PS-b-PMMA is used as the BCP material in the case described above in the embodiments, the present invention is not limited to this. The present invention is also applicable when a BCP composed of a block of organic matter such as PS-PDMS and a block containing silicon is used or when a BCP composed of a block of organic matter and a block containing a metal is used.

According to the pattern forming method in at least one of the embodiments described above, a pattern provided with an elliptical hole having a protrusion on the hole bottom is formed, and this pattern is used as a physical guide to form a block copolymer layer including first and second blocks, and then the block copolymer layer is microphase-separated. Therefore, hole patterns based on the DSA can be accurately formed without displacement.

According to the manufacturing method of the semiconductor device in at least one of the embodiments described above, a pattern formed by the above pattern forming method is used as a mask to fabricate a foundation film, so that a micropattern can be formed with the original accuracy of the DSA.

Furthermore, according to the template in at least one of the embodiments described above, the slit trench includes the elliptical transmissive pattern provided in the minor axis direction, so that physical guide including a plurality of hole patterns can be accurately formed without displacement.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of forming a pattern, the method comprising:
   forming a first layer on a fabrication target film;
   making a mold and the first layer push each other to form a protrusion on the fabrication target film, and forming a first region and a second region, the first region being surrounded by the first layer and the protrusion, the second region being surrounded by the first layer and contacting the first region via the protrusion;
   forming a block copolymer layer comprising first and second blocks in the first region and the second region;
   phase-separating the block copolymer layer, forming a second layer and a third layer surrounded by the second layer in the first region, and forming a fourth layer and a fifth layer surrounded by the fourth layer in the second region; and
   removing the third and fifth layers.

2. The method of claim 1,
   wherein a first length of the protrusion in a first direction perpendicular to a surface of the fabrication target film is equal to or more than ⅓ of a second length of the first layer in the first direction and is smaller than the second length.

3. The method of claim 1,
   wherein first and second patterns which are formed by removing the third and fifth layers, respectively, are hole patterns, and
   the following relational expression is satisfied:

$$2a < c < 4a \qquad \text{Expression (2)}$$

in which "a" is the diameter of a circle circumscribing the hole, and "c" is the width of the first region or the second region in a direction perpendicular to a direction in which the first region and the second region range.

4. The method of claim 1,
   wherein first and second patterns which are formed by removing the third and fifth layers, respectively, are hole patterns, and
   the following relational expression is satisfied:

$$2a < b < 4a \qquad \text{Expression (3)}$$

in which "a" is the diameter of a circle circumscribing the hole, and "b" is the width of the first region or the second region in a direction parallel to a direction in which the first region and the second region range.

5. The method of claim 1,
   wherein first and second patterns which are formed by removing the third and fifth layers, respectively, are hole patterns, and
   the following relational expression is satisfied:

$$a < d < 4a \qquad \text{Expression (4)}$$

in which "a" is the diameter of a circle circumscribing the hole, and "d" is a third length of the second or fourth layer in a first direction perpendicular to the surface of the fabrication target film.

6. The method of claim 1, further comprising
   forming a sixth layer before the formation of the first layer; and
   transferring patterns of the first layer and the protrusion to the sixth layer.

7. The method of claim 1, further comprising
   sequentially forming sixth and seventh layers before the formation of the first layer; and
   transferring patterns of the first layer and the protrusion to the sixth and seventh layers.

8. A template comprising:
   a transmissive substrate; and
   a transmissive pattern which is formed on the substrate and which comprises a first region and a second region,
   wherein a trench is provided between the first region and the second region.

9. The template of claim 8,
   wherein the height of the trench in a first direction perpendicular to a surface where the pattern is provided among surfaces of the substrate is smaller than the height of the pattern in the first direction.

10. The template of claim 8,
    wherein the pattern comprises an elliptical or circular shape.

11. A manufacturing method of a semiconductor device, the method comprising:
    forming a first layer on a fabrication target film;
    making a mold and the first layer push each other to form a protrusion on the fabrication target film, and forming a first region and a second region, the first region being surrounded by the first layer and the protrusion, the second region being surrounded by the first layer and contacting the first region via the protrusion;
    forming a block copolymer layer comprising first and second blocks in the first region and the second region;
    phase-separating the block copolymer layer, forming a second layer and a third layer surrounded by the second layer in the first region, and forming a fourth layer and a fifth layer surrounded by the fourth layer in the second region;
    removing the third and fifth layers; and
    using first and second patterns which are formed by removing the third and fifth layers, respectively, as masks to fabricate the fabrication target film.

12. The method of claim 11,
    wherein a first length of the protrusion in a first direction perpendicular to the surface of the fabrication target film is equal to or more than ⅓ of a second length of the first layer in the first direction and is smaller than the second length.

13. The method of claim 11,
    wherein first and second patterns which are formed by removing the third and fifth layers, respectively, are hole patterns, and
    the following relational expression is satisfied:

$$2a < c < 4a \qquad \text{Expression (2)}$$

in which "a" is the diameter of a circle circumscribing the hole, and "c" is the width of the first region or the second region in a direction perpendicular to a direction in which the first region and the second region range.

14. The method of claim 11,
    wherein first and second patterns which are formed by removing the third and fifth layers, respectively, are hole patterns, and
    the following relational expression is satisfied:

$$2a < b < 4a \qquad \text{Expression (3)}$$

in which "a" is the diameter of a circle circumscribing the hole, and "b" is the width of the first region or the second region in a direction parallel to a direction in which the first region and the second region range.

15. The method of claim 11,
wherein first and second patterns which are formed by removing the third and fifth layers, respectively, are hole patterns, and
the following relational expression is satisfied:

$$a<d<4a \quad \text{Expression (4)}$$

in which "a" is the diameter of a circle circumscribing the hole, and "d" is a third length of the second or fourth layer in a first direction perpendicular to the surface of the fabrication target film.

16. The method of claim 11, further comprising
forming a sixth layer before the formation of the first layer; and
transferring patterns of the first layer and the protrusion to the sixth layer.

17. The method of claim 11, further comprising
sequentially forming sixth and seventh layers before the formation of the first layer; and
transferring patterns of the first layer and the protrusion to the sixth and seventh layers.

* * * * *